(12) United States Patent
Kim et al.

(10) Patent No.: US 11,723,247 B2
(45) Date of Patent: Aug. 8, 2023

(54) DISPLAY DEVICE

(71) Applicant: Samsung Display Co., Ltd., Yongin-si (KR)

(72) Inventors: Soon Dong Kim, Yongin-si (KR); Jin Wook Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/263,533

(22) PCT Filed: Feb. 8, 2019

(86) PCT No.: PCT/KR2019/001596
§ 371 (c)(1),
(2) Date: Jan. 26, 2021

(87) PCT Pub. No.: WO2020/032336
PCT Pub. Date: Feb. 13, 2020

(65) Prior Publication Data
US 2021/0175318 A1    Jun. 10, 2021

(30) Foreign Application Priority Data
Aug. 8, 2018    (KR) .................. 10-2018-0092364

(51) Int. Cl.
*H10K 59/131*    (2023.01)
*G09G 3/3233*    (2016.01)

(52) U.S. Cl.
CPC ......... *H10K 59/131* (2023.02); *G09G 3/3233* (2013.01); *G09G 2300/0842* (2013.01); *G09G 2310/0202* (2013.01)

(58) Field of Classification Search
CPC ............ H01L 27/3276; H01L 27/3279; G09G 3/3233
See application file for complete search history.

(56) References Cited

U.S. PATENT DOCUMENTS 8,188,941 B2    5/2012    Iida et al.
8,686,927 B2    4/2014    Kang et al.
(Continued)

FOREIGN PATENT DOCUMENTS

JP    2008-129157    6/2008
KR    10-2012-0044499    5/2012
(Continued)

OTHER PUBLICATIONS

Office Action dated Jun. 21, 2023 from the Korean Patent Office for Korean Patent Application No. 10-2018-0092364 (with English Translation).

*Primary Examiner* — Sardis F Azongha
(74) *Attorney, Agent, or Firm* — H.C. Park & Associates, PLC

(57) ABSTRACT

Disclosed herein is a display device. The display device includes a plurality of data lines to supply data signals, a plurality of pixels each including a light-emitting element, a first transistor to control current flowing through the light-emitting element, and a second transistor connected between the first transistor and one of the plurality of data lines, and a conductive pattern disposed on and connected to the second transistor through a first contact hole. The data line is disposed on a layer different from that of the bridge pattern, and is connected to the bridge pattern through a second contact hole. The first contact hole and the second contact hole overlap each other, when viewed on a plane.

14 Claims, 7 Drawing Sheets

(56) References Cited

U.S. PATENT DOCUMENTS

| | | | |
|---|---|---|---|
| 8,730,132 B2 * | 5/2014 | Choi | ................... G09G 3/3233 345/76 |
| 9,117,783 B2 | 8/2015 | Jin | |
| 9,231,000 B2 | 1/2016 | Ko et al. | |
| 9,324,264 B2 | 4/2016 | Jeong et al. | |
| 9,372,379 B2 | 7/2016 | Choi et al. | |
| 10,410,578 B2 | 9/2019 | Song et al. | |
| 10,573,243 B2 * | 2/2020 | Choi | ................... H01L 51/5203 |
| 10,650,748 B2 | 5/2020 | Kim et al. | |
| 10,735,629 B2 * | 8/2020 | Son | ................... H01L 27/1222 |
| 2014/0218347 A1 | 8/2014 | Lee et al. | |
| 2016/0233288 A1 | 8/2016 | Lee et al. | |
| 2018/0076273 A1 | 3/2018 | Kim et al. | |

FOREIGN PATENT DOCUMENTS

| | | |
|---|---|---|
| KR | 10-2013-0091136 A | 8/2013 |
| KR | 10-2014-0099025 | 8/2014 |
| KR | 10-2014-0108023 | 9/2014 |
| KR | 10-2014-0140967 A | 12/2014 |
| KR | 10-2015-0014563 | 2/2015 |
| KR | 10-2016-0092530 | 8/2016 |
| KR | 10-2016-0096786 | 8/2016 |
| KR | 10-2018-0030363 | 3/2018 |

\* cited by examiner

DISPLAY DEVICE

CROSS-REFERENCE TO RELATED APPLICATION

This application is the National Stage of International Application No. PCT/KR2019/001596, filed on Feb. 8, 2019, and claims priority from and the benefit of Korean Patent Application No. 10-2018-0092364, filed on Aug. 8, 2018, each of which is incorporated by reference for all purposes as if fully set forth herein.

BACKGROUND

Field

Exemplary implementations of the invention relate generally to a display device, and more specifically, to a display device including pixels connected to signal lines.

Discussion of the Background

An organic light-emitting display device includes a plurality of pixels including a display element such as a light-emitting element. Each pixel is connected to signal lines, and includes a plurality of thin-film transistors to drive the light-emitting element.

The above information disclosed in this Background section is only for understanding of the background of the inventive concepts, and, therefore, it may contain information that does not constitute prior art.

SUMMARY

Applicant discovered that thin film transistors and a conductive pattern associated with a signal line may form a parasitic capacitor unintentionally, which may deteriorate the display quality of the organic light-emitting display device.

Display devices constructed according to the principles and exemplary implementations of the invention have improved display quality. For example, the display device may include a conductive pattern and/or contact holes to connect a transistor of a pixel to a data line, and the conductive pattern and/or contact holes may overlap each other. Accordingly, a parasitic capacitor that may be formed between the conductive pattern and another transistor of the pixel may be effectively removed, thereby improving the display quality of the display device.

Additional features of the inventive concepts will be set forth in the description which follows, and in part will be apparent from the description, or may be learned by practice of the inventive concepts.

According to one aspect of the invention, a display device, includes: a plurality of data lines to supply data signals; a plurality of pixels each including a light-emitting element, a first transistor to control current flowing through the light-emitting element, and a second transistor connected between the first transistor and one of the plurality of data lines; and a conductive pattern disposed on and connected to the second transistor through a first contact hole. The data line is disposed on a layer different from that of the bridge pattern, and is connected to the bridge pattern through a second contact hole, and the first contact hole and the second contact hole overlap each other, when viewed on a plane.

Each of the first and second transistors may include: a semiconductor pattern disposed on a substrate, and including an active pattern, and a first electrode and a second electrode connected to the active pattern; and a gate electrode disposed on the active pattern. The first contact hole may be connected to the first electrode of the second transistor.

The display device may further include: a gate insulating layer disposed on the semiconductor pattern; a first interlayer insulating layer disposed on the gate insulating layer; a second interlayer insulating layer disposed on the first interlayer insulating layer; and a third interlayer insulating layer disposed on the second interlayer insulating layer. The gate electrode may be disposed on the gate insulating layer.

The conductive pattern may include a bridge pattern; the bridge pattern may be disposed on the second interlayer insulating layer, and the first contact hole may pass through the gate insulating layer, the first interlayer insulating layer, and the second interlayer insulating layer.

The data line may be disposed on the third interlayer insulating layer, and the second contact hole may pass through the third interlayer insulating layer.

Each of the plurality of pixels may further include: a third transistor connected between the second electrode and the gate electrode of the first transistor; a fourth transistor connected between a first electrode of the third transistor and an initialization power source; a fifth transistor connected between a first power source and the first transistor; a sixth transistor connected between the first transistor and a first electrode of the light-emitting element; and a seventh transistor connected between the initialization power source and the first electrode of the light-emitting element.

Each of the third to seventh transistors may include: a semiconductor pattern disposed on the substrate, and including an active pattern, and a first electrode and a second electrode connected to the active pattern; and a gate electrode disposed on the active pattern.

The bridge pattern may be spaced apart from the semiconductor pattern of the fourth transistor, when viewed on a plane.

The bridge pattern may be spaced apart from the semiconductor pattern of the seventh transistor, when viewed on a plane.

The display device may further include: one or more scan lines to supply one or more scan signals to the gate electrodes of the second transistor, the third transistor, the fourth transistor, and the seventh transistor. The one or more scan lines may be disposed on the gate insulating layer.

The display device may further include: an emission line to supply an emission signal to the gate electrode of each of the fifth transistor and the sixth transistor. The emission line may be disposed on the gate insulating layer.

Each of the plurality of pixels may further include: a storage capacitor connected between the first power source and the gate electrode of the first transistor.

The storage capacitor may include a lower electrode disposed on the gate insulating layer, and an upper electrode disposed on the first interlayer insulating layer.

Each of the plurality of data lines may include a first sub data line extending in a first direction and a second sub data line extending in the first direction, and the first sub data line and the second sub data line may be provided on both sides of a pixel column in which at least two or more of the plurality of pixels are arranged in the first direction.

One of the pixels of the pixel column may be connected to the first sub data line, and another one of the pixels of the pixel column adjacent to the pixel connected to the first sub data line may be connected to the second sub data line.

The display device may further include: a plurality of demultiplexers each connected to some of the plurality of data lines.

According to another aspect of the invention, a display device may include: a data line to supply a data signal a pixel including a light-emitting element, a first transistor to control current flowing through the light-emitting element, a second transistor electrically connected to the data line and the first transistor, and one or more third transistors electrically connected to at least one of the light-emitting element, the first transistor, and the second transistor; and a conductive pattern disposed on and connected to a semiconductor pattern of the second transistor. The data line is disposed on the conductive pattern and electrically connected to the semiconductor pattern of the second transistor through the conductive pattern, and the conductive pattern overlaps the semiconductor pattern of the second transistor without overlapping semiconductor patterns of the one or more third transistors.

The conductive pattern may be connected to the semiconductor pattern of the second transistor through a first contact hole, the data line may be connected to the conductive pattern through a second contact hole, and the first contact hole and the second contact hole may overlap each other.

The display device may further include a scan line to supply a scan signal. The second transistor may be configured to transfer the data signal to the first transistor in response to the scan signal.

The conductive pattern may include a bridge pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4 is a plan view of an exemplary embodiment of a representative one of the pixels of

FIG. 3.

DETAILED DESCRIPTION

Figure 1:
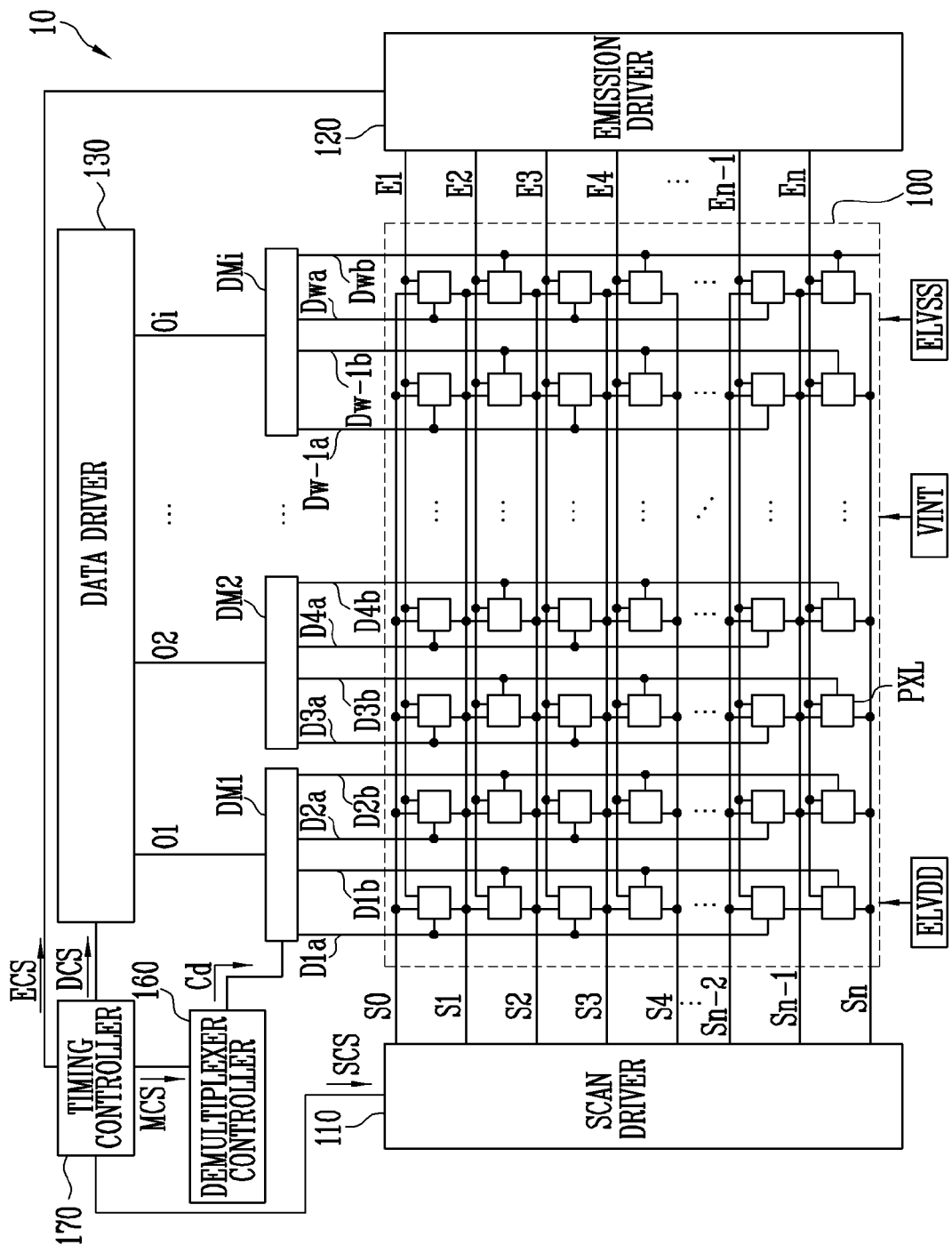
FIG. 1 is a block diagram of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of an exemplary embodiment of a display device constructed according to the principles of the invention.

Referring to FIG. 1, a display device 10 may include pixels PXL, a scan driver 110, an emission driver 120, a data driver 130, demultiplexers DM1 to DMi, a demultiplexer controller 160, and a timing controller 170.

The pixels PXL may be connected to a plurality of scan lines S0 to Sn, emission lines E1 to En, and data lines D1a to Dwb. Thus, the pixels PXL may be supplied with scan signals and emission signals through the scan lines S0 to Sn and the emission lines E1 to En, respectively. Furthermore, the pixels PXL may be supplied with data signals through the data lines D1a to Dwb.

The pixels PXL may be connected to a first power source ELVDD, a second power source ELVSS, and an initialization power source VINT to receive power voltages therefrom.

Each of the pixels PXL may control current flowing from the first power source ELVDD to the second power source ELVSS via a light-emitting element in response to the data signal. The light-emitting element may generate light having a luminance corresponding to the current.

The scan driver 110 may supply the scan signals to the scan lines S0 to Sn in response to a scan drive control signal SCS supplied from the timing controller 170. For example, the scan driver 110 may sequentially supply the scan signals to the scan lines S0 to Sn. When the scan signals are sequentially supplied to the scan lines S0 to Sn, the pixels PXL may be sequentially selected on a horizontal line basis. Here, each of the scan signals may have a voltage level at which a transistor that is supplied with the scan signal may be turned on.

The emission driver 120 may supply the emission signals to the emission lines E1 to En in response to an emission drive control signal ECS supplied from the timing controller 170. For example, the emission driver 120 may sequentially supply the emission signals to the emission lines E1 to En. Here, the emission signal may have a voltage level at which a transistor that is supplied with the emission signal may be turned off.

The data driver 130 may supply the data signals to output lines O1 to Oi in response to a data drive control signal DCS. In other words, the data driver 130 may supply the data signals to the demultiplexers DM1 to DMi through the output lines O1 to Oi.

The demultiplexers DM1 to DMi may be supplied with the data signals from the data driver 130, and may supply the data signals to the data lines D1a to Dwb. For example, the demultiplexers DM1 to DMi may receive the data signals through the output lines O1 to Oi, and may time-divisionally output the data signals to the data lines D1a to Dwb more than the output lines O1 to Oi. Therefore, the pixels PXL may be supplied with the data signals through the data lines D1a to Dwb. For example, the number of the data lines D1a to Dwb may be set to four times as large as that of the output lines O1 to Oi of the data driver 130.

A capacitor may be provided in each of the data lines D1a to Dwb so as to store signals applied to the data lines D1a to Dwb. Here, the capacitors may be present in the data lines D1a to Dwb due to parasitic capacitance. Furthermore, the capacitors may be physically installed in the data lines D1a to Dwb.

The demultiplexer controller 160 may control the operation of the demultiplexers DM1 to DMi through a driving signal Cd. For example, the driving signal Cd may function to control the operation of transistors included in the demultiplexers DM1 to DMi, respectively. The demultiplexer controller 160 may receive a demultiplexer control signal MCS from the timing controller 170, and may generate a corresponding driving signal Cd.

While FIG. 1 illustrates the demultiplexer controller 160 separately from the timing controller 170, exemplary embodiments are not limited thereto. For example, the demultiplexer controller 160 may be integrated with the timing controller 170 as necessary.

The timing controller 170 may control the scan driver 110, the emission driver 120, the data driver 130, and the demultiplexer controller 160. The timing controller 170 may supply the scan drive control signal SCS and the emission drive control signal ECS to the scan driver 110 and the emission driver 120, respectively.

Furthermore, the timing controller 170 may supply the data drive control signal DCS and the demultiplexer control signal MCS to the data driver 130 and the demultiplexer controller 160, respectively.

While the scan driver 110, the emission driver 120, the data driver 130, the demultiplexer controller 160, and the timing controller 170 are shown in FIG. 1 as being separated from each other for the convenience of description, at least some of components may be integrated.

The first power source ELVDD, the second power source ELVSS, and the initialization power source VINT may provide power voltage to the pixels PXL located in a pixel component 100. For example, the first power source ELVDD may be a high-potential power source, and the second power source ELVSS may be a low-potential power source. For instance, the first power source ELVDD may be set to a positive voltage, and the second power source ELVSS may be set to a negative voltage or ground voltage. Furthermore, the initialization power source VINT may be set to a voltage lower than that of a data signal.

Figure 2:
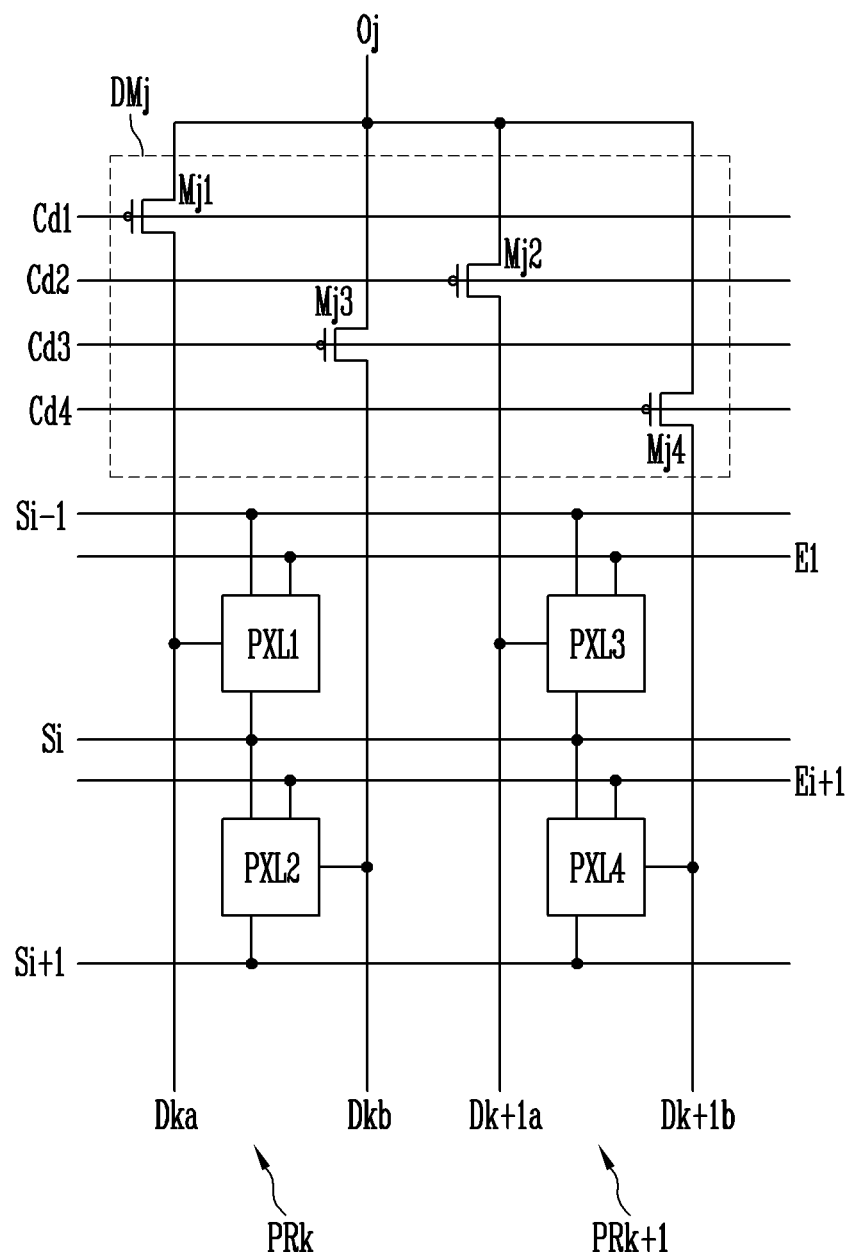
FIG. 2 is a block diagram of an exemplary embodiment of a representative one of the demultiplexers of FIG. 1 and some of the pixels connected thereto.

FIG. 2 is a block diagram of an exemplary embodiment of a representative one of the demultiplexers of FIG. 1 and some of the pixels connected thereto. For the convenience of description, FIG. 2 mainly illustrates a k-th pixel column PRk, a k+1-th pixel column PRk+1, and a j-th demultiplexer DMj connected to a j-th (j is a natural number) output line Oj that transmits a data signal outputted from the data driver 130 of FIG. 1.

Referring to FIGS. 1 and 2, the j-th multiplexer DMj may be connected to the j-th output line Oj, k-th data lines Dka and Dkb, and k+1-th data lines Dk+1a and Dk+1b. Each of the data lines Dka, Dkb, Dk+1a, and Dk+1b may include first sub data lines Dka and Dk+1a and second sub data lines Dkb and Dk+1b. For example, the k-th data lines Dka and Dkb may include the first sub data line Dka and the second sub data line Dkb, and the k+1-th data lines Dk+1a and Dk+1b may include the first sub data line Dk+1a and the second sub data line Dk+1b.

The j-th demultiplexer DMj may time-divisionally transmit the data signal, outputted from the data driver 130 and transmitted through the j-th output line Oj, to the k-th data lines Dka and Dkb and the k+1-th data lines Dk+1a and Dk+1b in response to first to fourth driving signals Cd1 to Cd4.

The pixels PXL may be grouped into pixel columns, and each of the pixel columns may include the pixels PXL arranged in a direction substantially the same as the direction in which the data lines D1a to Dwb extend. For example, the pixels PXL of the pixel column may be arranged in a vertical direction. The k-th data lines Dka and Dkb may be connected to pixels PXL1 and PXL2 of a pixel column PRk. Furthermore, the k+1-th data lines Dk+1a and Dk+1b may also be connected to pixels PXL3 and PXL4 of a pixel column PRk+1.

Each of the first sub data lines Dka and Dk+1a may be connected to some of the pixels PXL1 to PXL4 of the pixel columns PRk and PRk+1, and each of the second sub data lines Dkb and Dk+1b may be connected to the other pixels PXL1 to PXL4 of the pixel columns PRk and PRk+1.

For example, the pixels PXL1 and PXL2 of the k-th pixel column PRk may include first pixels PXL1 and second pixels PXL2 that are alternately arranged. Here, the first pixels PXL1 may be connected to the first sub data line Dka, and the second pixels PXL2 may be connected to the second sub data line Dkb. Furthermore, the pixels PXL3 and PXL4 of the k+1-th pixel column PRk+1 may include third pixels PXL3 and fourth pixels PXL4 that are alternately arranged. Here, the third pixels PXL3 may be connected to the first sub data line Dk+1a, and the fourth pixels PXL4 may be connected to the second sub data line Dk+1b.

In an exemplary embodiment, the third pixels PXL3 may be connected to the second sub data line Dk+1b, and the fourth pixels PXL4 may be connected to the first sub data line Dk+1a.

The j-th demultiplexer DMj may include first to fourth transistors Mj1 to Mj4 to transmit a data signal.

The first transistor Mj1 may be connected between the j-th output line Oj and the first sub data line Dka of the k-th data lines, and may be turned on and turned off in response to a first driving signal Cd1. The second transistor Mj2 may be connected between the j-th output line Oj and the first sub data line Dk+1a of the k+1-th data lines, and may be turned on and turned off in response to a second driving signal Cd2. The third transistor Mj3 may be connected between the j-th output line Oj and the second sub data line Dkb of the k-th data lines, and may be turned on and turned off in response to a third driving signal Cd3. The fourth transistor Mj4 may be connected between the j-th output line Oj and the second sub data line Dk+1b of the k+1-th data lines, and may be turned on and turned off in response to a fourth driving signal Cd4.

When the first driving signal Cd1 is supplied, the first transistor Mj1 may be turned on. Thus, the data signal of the j-th output line Oj may be supplied to the first sub data line Dka of the k-th data lines. Furthermore, when the second driving signal Cd2 is supplied, the second transistor Mj2 may be turned on. Thus, the data signal of the j-th output line Oj may be supplied to the first sub data line Dk+1a of the k+1-th data lines. Furthermore, when the third driving signal Cd3 is supplied, the third transistor Mj3 may be turned on. Thus, the data signal of the j-th output line Oj may be supplied to the second sub data line Dkb of the k-th data lines. Furthermore, when the fourth driving signal Cd4 is supplied, the fourth transistor Mj4 may be turned on. Thus, the data signal of the j-th output line Oj may be supplied to the second sub data line Dk+1b of the k+1-th data lines.

The first to fourth transistors Mj1 to Mj4 may be turned on at different periods. To this end, supply periods of the first to fourth driving signals Cd1 to Cd4 may not overlap each other.

Among four sub data lines Dka, Dkb, Dk+1a, and Dk+1b connected to two adjacent pixel columns PRk and PRk+1, the first sub data lines Dka and Dk+1a may be connected to the first and third pixels PXL1 and PXL3 located and/or arranged in the same horizontal line.

Among four sub data lines Dka, Dkb, Dk+1a, and Dk+1b connected to two adjacent pixel columns PRk and PRk+1, the second sub data lines Dkb and Dk+1b may be connected to the second and fourth pixels PXL2 and PXL4 located and/or arranged in the same horizontal line.

Figure 3:
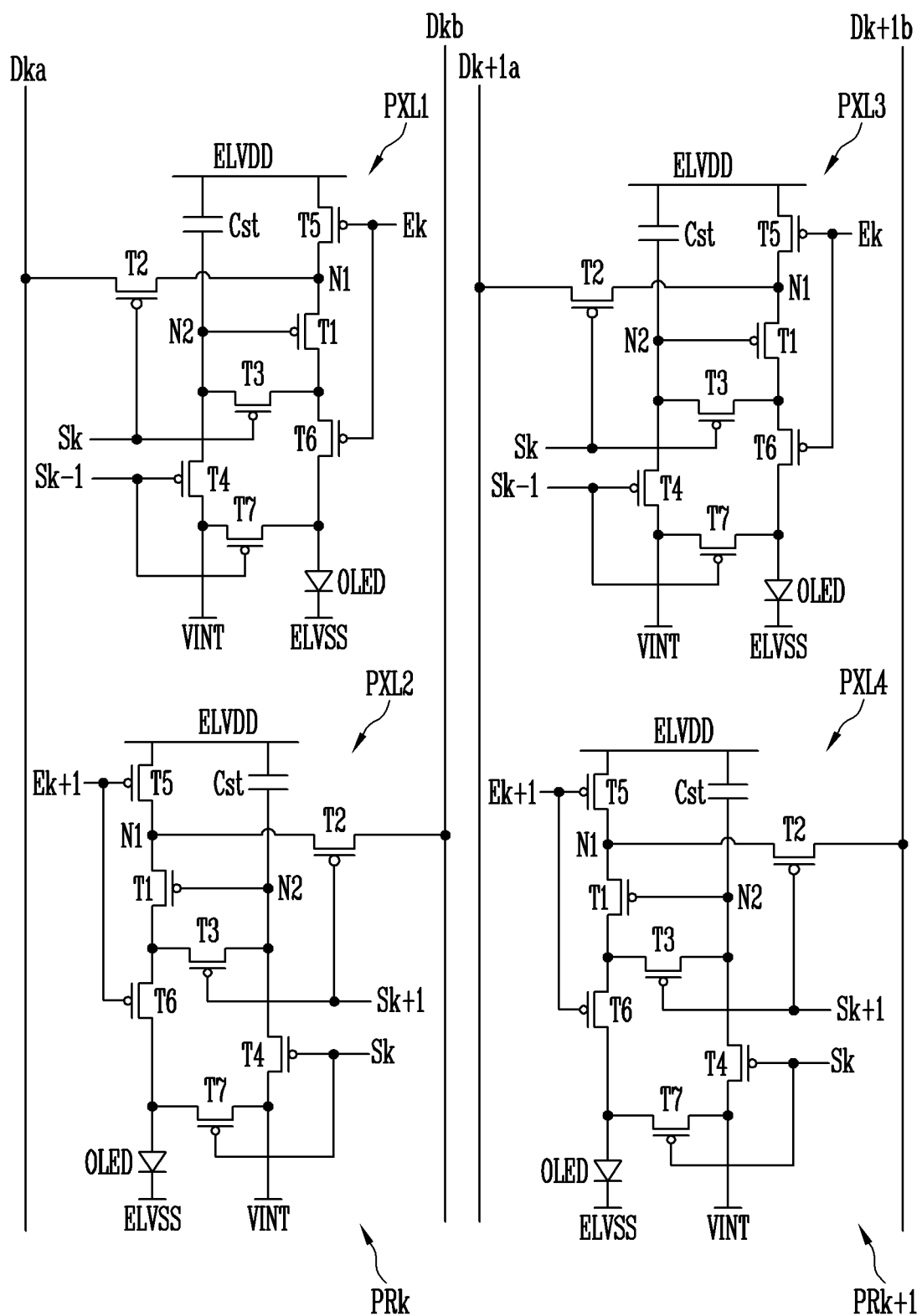
FIG. 3 is a circuit diagram of an exemplary embodiment of the pixels of FIG. 2.

FIG. 3 is a circuit diagram of an exemplary embodiment of the pixels of FIG. 2. For the convenience of description, the k-th pixel column PRk and the k+1-th pixel column PRk+1 positioned adjacent to each other are mainly illustrated.

Referring to FIG. 3, the first pixel PXL1 may include a pixel circuit having a plurality of transistors T1 to T7 and a storage capacitor Cst, and a light-emitting element OLED.

An anode electrode of the light-emitting element OLED may be connected to the pixel circuit, and a cathode electrode thereof may be connected to the second power source ELVSS. The light-emitting element OLED may emit light having a predetermined luminance corresponding to current supplied from the pixel circuit. The first power source ELVDD supplied to the anode electrode may be set to a voltage higher than that of the second power source ELVSS to allow current to flow to the light-emitting element OLED.

The pixel circuit may control, in response to a data signal, current flowing from the first power source ELVDD to the second power source ELVSS via the light-emitting element OLED. To this end, the pixel circuit may include the first transistor T1, the second transistor T2, the third transistor T3, the fourth transistor T4, the fifth transistor T5, the sixth transistor T6, the seventh transistor T7, and the storage capacitor Cst.

A first electrode of the first transistor (e.g., driving transistor) T1 may be connected to a first node N1, and a second electrode thereof may be connected to a first electrode of the sixth transistor T6. A gate electrode of the first transistor T1 may be connected to a second node N2. The first transistor T1 may control current supplied from the first power source ELVDD to the second power source ELVSS via the light-emitting element OLED in response to a voltage stored in the storage capacitor Cst.

The second transistor T2 may be connected between the first sub data line Dka of k-th data lines and the first node N1. A gate electrode of the second transistor T2 may be connected to a k-th scan line Sk. When a scan signal is supplied to the k-th scan line Sk, the second transistor T2 may be turned on to electrically couple the first sub data line Dka of the k-th data lines and the first node N1.

The third transistor T3 may be connected between a second electrode of the first transistor T1 and the second node N2. A gate electrode of the third transistor T3 may be connected to a k-th scan line Sk. When a scan signal is supplied to the k-th scan line Sk, the third transistor T3 is turned on so that the first transistor T1 may be connected in the form of a diode.

The fourth transistor T4 may be connected between the second node N2 and the initialization power source VINT. A gate electrode of the fourth transistor T4 may be connected to a k-1-th scan line Sk-1. When a scan signal is supplied to the k-1-th scan line Sk-1, the fourth transistor T4 is turned on so that the voltage of the initialization power source VINT may be supplied to the second node N2.

The fifth transistor T5 may be connected between the first power source ELVDD and the first node N1. A gate electrode of the fifth transistor T5 may be connected to the k-th emission line Ek. The fifth transistor T5 may be turned off when the emission signal is supplied to the k-th emission line Ek, and may be turned on when the emission signal is not supplied thereto.

The sixth transistor T6 may be connected between the second electrode of the first transistor T1 and the anode electrode of the light-emitting emitting OLED. A gate electrode of the sixth transistor T6 may be connected to the k-th emission line Ek. The sixth transistor T6 may be turned off when the emission signal is supplied to the k-th emission line Ek, and may be turned on when the emission signal is not supplied thereto.

The seventh transistor T7 may be connected between the anode electrode of the light-emitting element OLED and the initialization power source VINT. A gate electrode of the seventh transistor T7 may be connected to the k-1-th scan line Sk-1. When a scan signal is supplied to the k-1-th scan line Sk-1, the seventh transistor T7 is turned on so that a voltage of the initialization power source VINT may be supplied to the anode electrode of the light-emitting element OLED.

In another exemplary embodiment, a gate electrode of the seventh transistor T7 may be connected to the k-th scan line Sk or the k+1-th scan line Sk+1.

The voltage of the initialization power source VINT may be set to a voltage lower than that of a data signal. When the voltage of the initialization power source VINT is supplied to the anode electrode of the light-emitting element OLED, electric charges of the parasitic capacitor of the light-emitting element OLED is discharged. When the electric charges of the parasitic capacitor of the light-emitting element OLED is discharged, the black expression capability of the pixel PXL1 may be improved.

The storage capacitor Cst may be connected between the first power source ELVDD and the second node N2. The storage capacitor Cst may store a voltage corresponding both to a data signal and to a threshold voltage of the first transistor T1.

Here, the first electrode of each transistor T1, T2, T3, T4, T5, T6, and T7 may be set as one of a source electrode and a drain electrode. The second electrode of each transistor T1, T2, T3, T4, T5, T6, and T7 may be set as the other one of the source electrode and the drain electrode. For example, if the first electrode is set to the source electrode, the second electrode may be set to the drain electrode.

The second pixel PXL2 may be disposed alternately with the first pixel PXL1 in the same pixel column PRk. Such a second pixel PXL2 may have a circuit configuration similar to that of the first pixel PXL1.

However, since the second pixel PXL2 is positioned on a next horizontal line compared to the first pixel PXL1, the second pixel may be connected to the k-th scan line Sk, the k+1-th scan line Sk+1, and the k+1-th emission line Ek+1.

In this case, the gate electrode of the second transistor T2 and the gate electrode of the third transistor T3 may be connected to the k+1-th scan line Sk+1, the gate electrode of the fourth transistor T4 and the gate electrode of the seventh transistor T7 may be connected to the k-th scan line Sk, and the gate electrode of the fifth transistor T5 and the gate electrode of the sixth transistor T6 may be connected to the k+1-th emission line Ek+1.

Furthermore, the second pixel PXL2 may be connected to the second sub data line Dkb of the k-th data lines. Here, the second transistor T2 of the second pixel PXL2 may be connected between the second sub data line Dkb of the k-th data lines and the first node N1.

The third pixel PXL3 may have a circuit configuration similar to that of the first pixel PXL1, and may be disposed on the same horizontal line as the first pixel PXL1. Therefore, the third pixel PXL3 may be connected to the k-1-th scan line Sk-1, the k-th scan line Sk, and the k-th emission line Ek, as in the first pixel PXL1. Here, the second transistor T2 of the third pixel PXL3 may be connected between the first sub data line Dk+1a of the k+1-th data lines and the first node N1.

The fourth pixel PXL4 may be disposed alternately with the third pixel PXL3 in a k+1-th pixel column PRk+1. Such a fourth pixel PXL4 may have a circuit configuration similar to that of the third pixel PXL3.

Since the fourth pixel PXL4 is positioned on a next horizontal line compared to the third pixel PXL3, the fourth pixel may be connected to the k-th scan line Sk, the k+1-th scan line Sk+1, and the k+1-th emission line Ek+1.

Here, the gate electrode of the second transistor T2 of the fourth pixel PXL4 and the gate electrode of the third transistor T3 of the fourth pixel PXL2 may be connected to the k+1-th scan line Sk+1, the gate electrode of the fourth transistor T4 and the gate electrode of the seventh transistor T7 may be connected to the k-th scan line Sk, and the gate electrode of the fifth transistor T5 and the gate electrode of the sixth transistor T6 may be connected to the k+1-th emission line Ek+1.

The fourth pixel PXL4 may be connected to the second sub data line Dk+1b of the k+1-th data lines. Here, the second transistor T2 of the fourth pixel PXL4 may be connected between the second sub data line Dk+1b of the k+1-th data lines and the first node N1.

Figure 4:
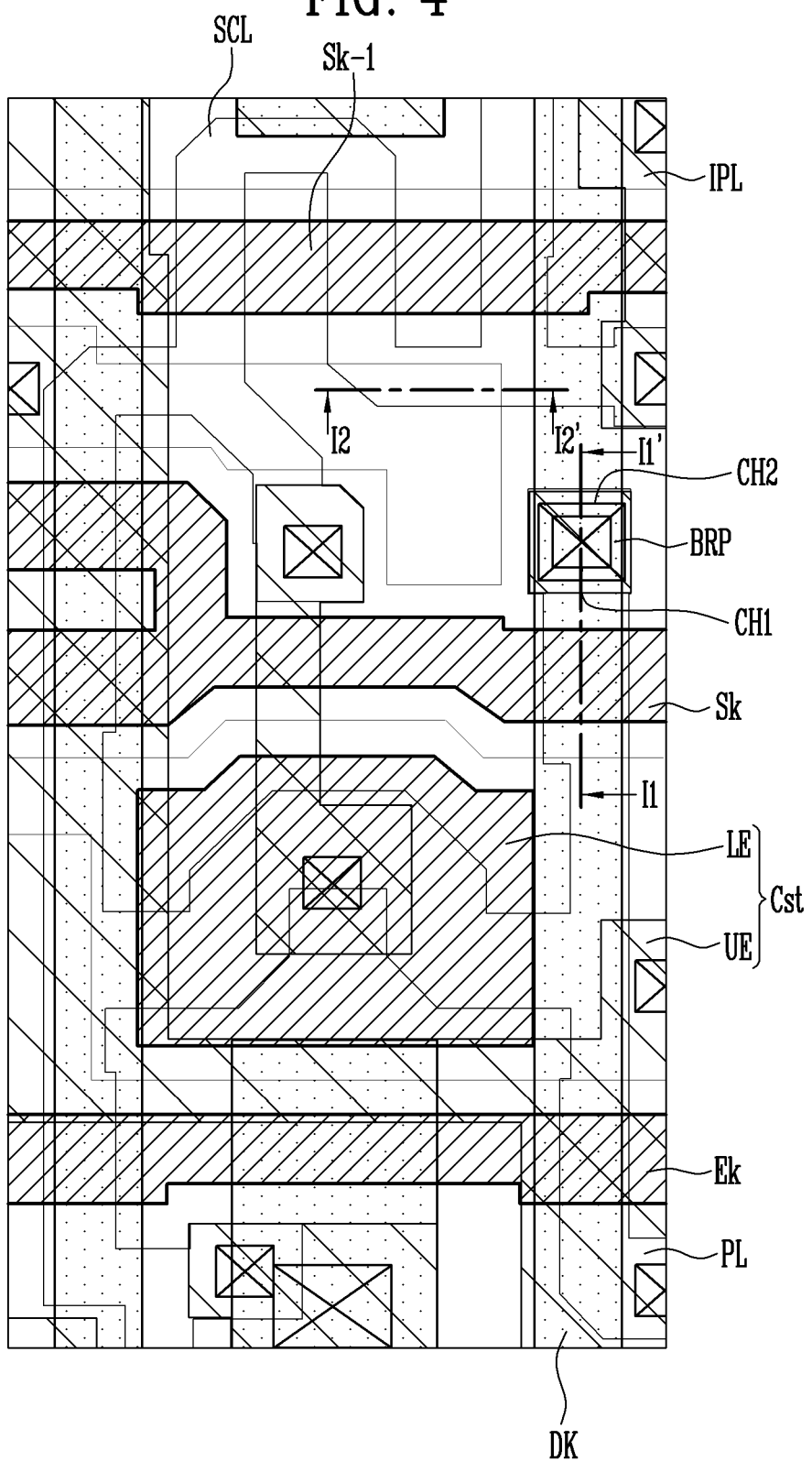
Figure 5:
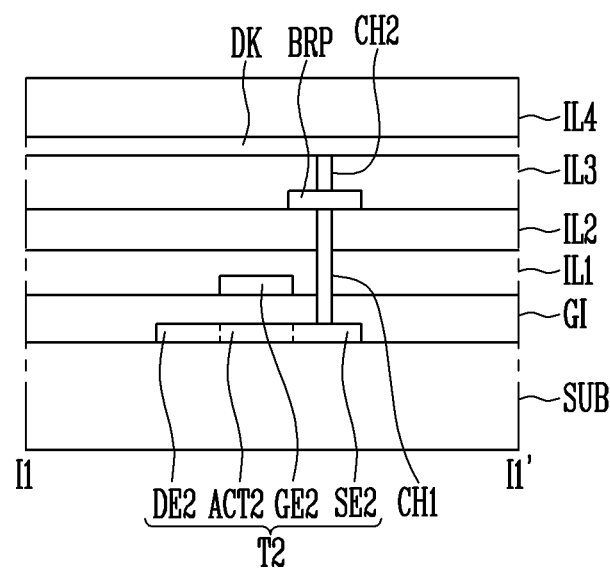
FIG. 5 is a cross-sectional view taken along line I1-I1' of FIG. 4.
Figure 6:
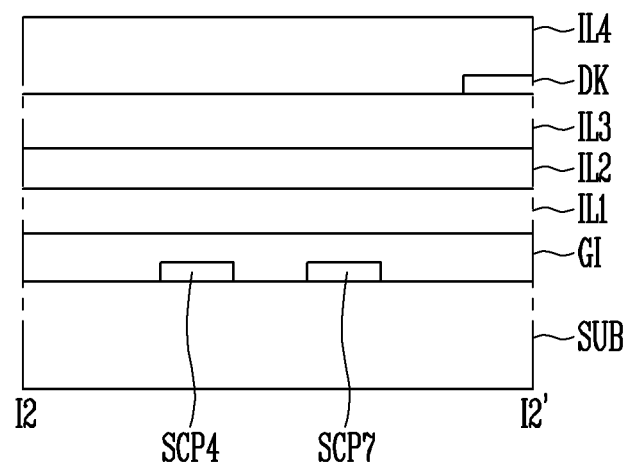
FIG. 6 is a cross-sectional view taken along line I2-I2' of FIG. 4.

FIG. 4 is a plan view of an exemplary embodiment of a representative one of the pixels of FIG. 3. FIG. 5 is a cross-sectional view taken along line of FIG. 4. FIG. 6 is a cross-sectional view taken along line I2-I2' of FIG. 4.

Referring to FIGS. 4 to 6, the pixel may be provided on a substrate SUB.

The substrate SUB may include a transparent insulating material to allow light transmission. The substrate SUB may be a rigid substrate. For example, the substrate SUB may include one of a glass substrate, a quartz substrate, a glass ceramic substrate, and a crystalline glass substrate.

The substrate SUB may be a flexible substrate. Here, the substrate SUB may be either a film substrate or a plastic substrate which includes a polymer organic material. For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, materials constituting the substrate SUB may be changed, and include, for example, fiber reinforced plastic (FRP).

Referring to FIGS. 4 to 6, a semiconductor layer SCL on the substrate SUB, a gate insulating layer GI provided on the semiconductor layer SCL, scan lines Sk-1 and Sk, an emission line Ek, a gate electrode, and a lower electrode LE of a storage capacitor Cst provided on the gate insulating layer GI, a first interlayer insulating layer IL1 provided on the scan lines Sk-1 and Sk, the emission line Ek, the gate electrode, and the lower electrode LE of the storage capacitor Cst, an upper electrode UE of the storage capacitor Cst and an initialization power line IPL provided on the first interlayer insulating layer ILL a second interlayer insulating layer IL2 provided on the upper electrode UE of the storage capacitor Cst and the initialization power line IPL, first conductive patterns provided on the second interlayer insulating layer IL2, a third interlayer insulating layer IL3 provided on the first conductive patterns, second conductive patterns provided on the third interlayer insulating layer IL3, and a fourth interlayer insulating layer IL4 provided on the second conductive patterns may be sequentially stacked. Furthermore, the light-emitting element may be provided on the fourth interlayer insulating layer IL4.

The semiconductor layer SCL may include a semiconductor material.

A buffer layer may be provided between the substrate SUB and the semiconductor layer SCL.

The buffer layer may prevent impurities from being diffused from the substrate SUB to the semiconductor layer SCL. The buffer layer may be provided in a single layer structure or a multilayer structure having at least two or more layers. The buffer layer may include at least one of an organic insulating layer and an inorganic insulating layer. The organic insulating layer may include an organic insulating material that may transmit light. The inorganic insulating layer may include at least one of silicon oxide, silicon nitride, and silicon oxynitride. When the buffer layer is provided as a multilayer structure, each layer may include the same material or may include different materials.

The gate insulating layer GI may include at least one of organic insulating layer and inorganic insulating layer. The organic insulating layer may include an organic insulating material that may transmit light. The organic insulating layer may include, for example, at least one of photoresist, polyacrylates resin, epoxy resin, phenolic resin, polyamides resin, polyimides resin, unsaturated polyesters resin, polyphenylene ethers resin, poly-phenylene sulfides resin, and benzocyclobutene resin. The inorganic insulating layer may include at least one of silicon oxide, silicon nitride, and silicon oxynitride.

The scan lines Sk−1 and Sk, the emission line Ek, the gate electrode, and the lower electrode LE of the storage capacitor Cst may include a metal material. The metal material may be made of at least one of gold (Au), silver (Ag), aluminum (Al), molybdenum (Mo), chrome (Cr), titanium (Ti), nickel (Ni), neodymium (Nd), copper (Cu), and an alloy thereof. The scan lines Sk−1 and Sk, the emission line Ek, the gate electrode, and the lower electrode LE of the storage capacitor Cst may be formed as a single layer, but is not limited thereto. For example, the scan lines Sk−1 and Sk, the emission line Ek, the gate electrode, and the lower electrode LE of the storage capacitor Cst may be formed as a multilayer structure composed of two or more stacked layers including at least one of gold (Au), silver (Ag), aluminum (Al), molybdenum (Mo), chromium (Cr), titanium (Ti), nickel (Ni), neodymium (Nd), copper (Cu), and alloys thereof.

The gate electrode may be formed integrally with the scan lines Sk-1 and Sk.

At least a portion of the semiconductor layer SCL and the gate electrode provided on the portion of the semiconductor layer SCL may form one transistor. Therefore, the semiconductor layer SCL may include a plurality of semiconductor patterns for the pixel, such as a semiconductor pattern forming the first transistor T1, a semiconductor pattern forming the second transistor T2, a semiconductor pattern forming the third transistor T3, a semiconductor pattern forming the fourth transistor T4, a semiconductor pattern forming the fifth transistor T5, a semiconductor pattern forming the sixth transistor T6, and a semiconductor pattern forming the seventh transistor T7. Each semiconductor pattern may include a first source electrode (or source region) and a first drain electrode (or drain region) doped with impurities, and an active pattern (or active region) that is not doped with impurities. For example, the semiconductor pattern of the second transistor T2 may include a drain electrode DE2, an active pattern ACT2, and a source electrode SE2.

Furthermore, the gate electrode may include the gate electrode of the first transistor T1, the gate electrode of the second transistor T2, the gate electrode of the third transistor T3, the gate electrode of the fourth transistor T4, the gate electrode of the fifth transistor T5, the gate electrode of the sixth transistor T6, and the gate electrode of the seventh transistor T7. Each of the gate electrodes may be located to overlap with the active pattern.

The first interlayer insulating layer IL1 may include at least one of polysiloxane, silicon oxide, silicon nitride, and silicon oxynitride.

The upper electrode UE of the storage capacitor Cst and the initialization power line IPL may be formed as a single-layer structure or a multilayer structure including at least one of gold (Au), silver (Ag), aluminum (Al), molybdenum (Mo), chrome (Cr), titanium (Ti), nickel (Ni), neodymium (Nd), copper (Cu), and an alloy thereof.

The second interlayer insulating layer IL2 may include at least one of an inorganic insulating layer and an organic insulating layer. For example, the second interlayer insulating layer IL2 may include at least one inorganic insulating layer. The inorganic insulating layer may include at least one of silicon oxide, silicon nitride, and silicon oxynitride. Furthermore, the second interlayer insulating layer IL2 may include at least one organic insulating layer. The organic insulating layer may include at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutene resin. Furthermore, the second interlayer insulating layer IL2 may have a multilayer structure including at least one inorganic insulating layer and at least one organic insulating layer.

The first conductive patterns may include a bridge pattern BRP and a power line PL.

Referring to FIGS. 4 and 5, some of the first conductive patterns, which is in the form of the bridge pattern BRP, may be connected to the source electrode SE2 of the second transistor T2 through a first contact hole CH1. The first contact hole CH1 may pass through the gate insulating layer GI, the first interlayer insulating layer ILL and the second interlayer insulating layer IL2 to connect the bridge pattern BRP to the source electrode SE2 of the second transistor T2.

Other ones of the first conductive patterns, which is in the form of the power line PL, may supply the first power source ELVDD to the pixel, and may be electrically connected to the source electrode of the fifth transistor T5 through a contact hole passing through the gate insulating layer GI, the first interlayer insulating layer ml, and the second interlayer insulating layer IL2.

The third interlayer insulating layer IL3 may include at least one of an inorganic insulating layer and an organic insulating layer. Furthermore, the third interlayer insulating layer IL3 may have a multilayer structure including at least one inorganic insulating layer and at least one organic insulating layer.

The second conductive patterns may include a data line DK.

Referring to FIGS. 4 and 5, the data line DK may be connected to the bridge pattern BRP through a second contact hole CH2 passing through the third interlayer insulating layer IL3. The source electrode SE2 of the second transistor T2 may be connected to the data line DK through the first contact hole CH1, the bridge pattern BRP, and the second contact hole CH2.

In this case, the first contact hole CH1 and the second contact hole CH2 may be located to overlap each other when viewed on a plane. The first contact hole CH1 and the second contact hole CH2 may overlap the bridge pattern BRP. The bridge pattern BRP may overlap the semiconductor pattern of the second transistor T2 without overlapping semiconductor patterns of other transistors of the pixel, such as the semiconductor patterns of the fourth and seventh transistors T4 and T7.

The fourth interlayer insulating layer RA may include an organic insulating material. The fourth interlayer insulating layer IL4 may include, for example, at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutene resin.

Figure 7:
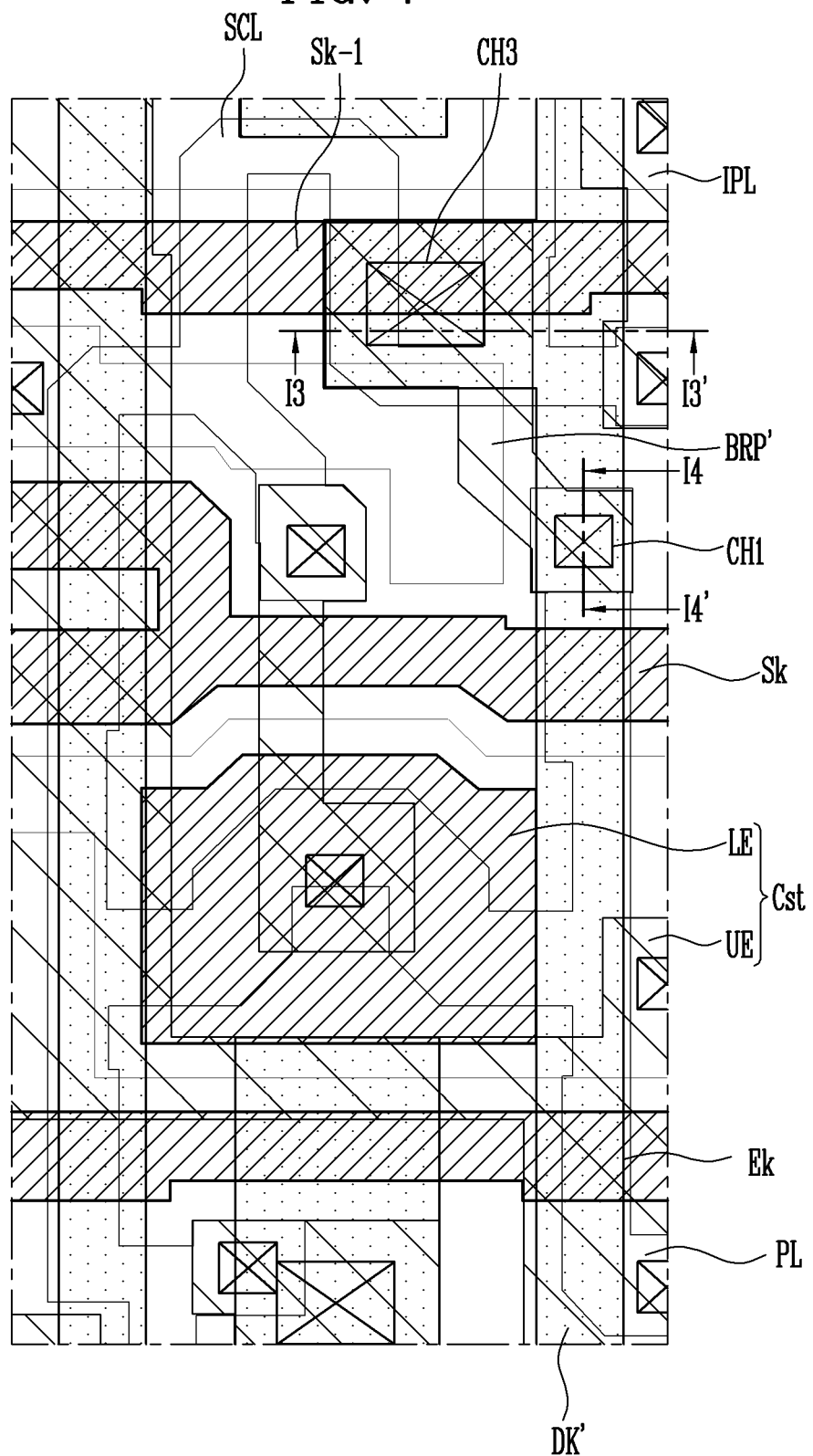
FIG. 7 is a plan view of a comparative pixel.
Figure 8:
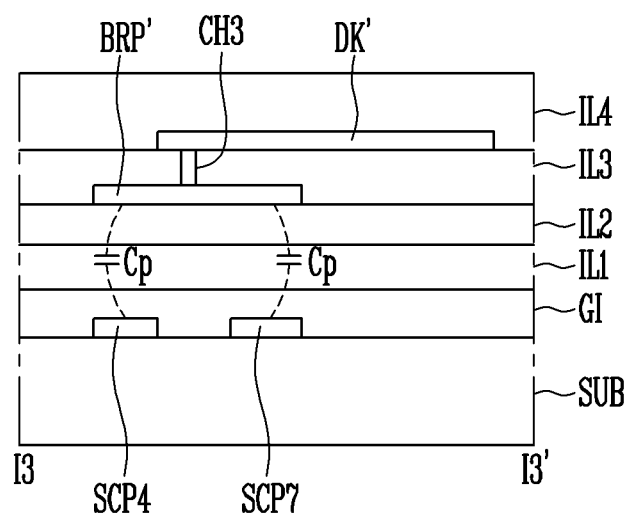
FIG. 8 is a cross-sectional view taken along line I3-I3' of FIG. 7.
Figure 9:
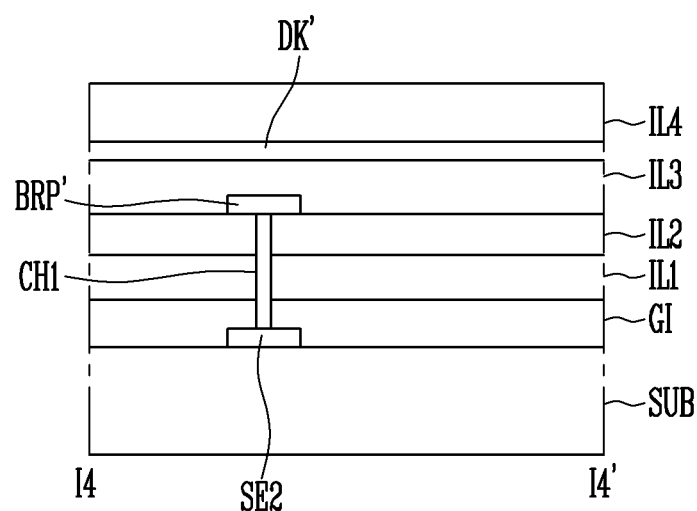
FIG. 9 is a cross-sectional view taken along line I4-I4' of FIG. 7.

FIG. 7 is a plan view of a comparative pixel. FIG. 8 is a cross-sectional view taken along line I3-I3' of FIG. 7. FIG. 9 is a cross-sectional view taken along line I4-I4' of FIG. 7.

Referring to FIGS. 7 to 9, unlike the pixel structure according to the illustrated embodiment, a bridge pattern BRP' coupling the source electrode SE2 of the second transistor T2 to a data line DK' is formed to overlap a semiconductor pattern SCP4 of the fourth transistor T4 and a semiconductor pattern SCP7 of the seventh transistor T7, when viewed on a plane.

In this case, as illustrated in FIG. 8, parasitic capacitors Cp may be formed between the bridge pattern BRP' and the semiconductor patterns SCP4 and SCP7. In this case, the fourth transistor T4 and the seventh transistor T7 are affected by a data signal supplied to the data line DK' by the parasitic capacitors Cp, which causes that the fourth transistor T4 and the seventh transistor T7 operate with relatively low reliability. For example, the fourth transistor T4 and the seventh transistor T7 may provide the initialization power source VINT to the gate electrode of the first transistor T1 and the anode electrode of the light-emitting element OLED, respectively, as shown in FIG. 3. However, when the fourth and seventh transistors T4 and T7 are affected by the data signal supplied to the data line DK' by the parasitic capacitors Cp, there is a problem that the voltage of the initialization power source VINT may be non-uniformly supplied.

According to the illustrated embodiment, as illustrated in FIGS. 5 and 6, the data line DK and/or the bridge pattern BRP connected to the data line DK are not provided on the semiconductor patterns SCP4 and SCP7 of the fourth transistor T4 and the seventh transistor T7, so that it is possible to solve the above-described problem. The bridge pattern BRP may overlap the semiconductor pattern of the second transistor T2 without overlapping other semiconductor patterns such as the semiconductor patterns SCP4 and SCP7 of the fourth and seventh transistors T4 and T7. Accordingly, parasitic capacitors between the bridge pattern BRP and other semiconductor patterns of the pixel may be prevented from being formed and therefore the pixel circuit may operate with relatively high reliability. Thus, the display device including the pixels may have the improved display quality.

The invention claimed is:
1. A display device, comprising:
a plurality of data lines to supply data signals;
a plurality of pixels each comprising a light-emitting element, a first transistor to control current flowing through the light-emitting element, a second transistor connected between the first transistor and one of the plurality of data lines, a third transistor connected between a second electrode and a gate electrode of the first transistor, a fourth transistor connected between a first electrode of the third transistor and an initialization power source, and an initialization transistor connected between the initialization power source and a first electrode of the light-emitting element, each of the first transistor, the second transistor, the third transistor, the fourth transistor and the initialization transistor comprising a semiconductor pattern; and a conductive pattern disposed on and connected to the second transistor through a first contact hole, wherein the data line is disposed on a layer different from that of the conductive pattern, and is connected to the conductive pattern through a second contact hole, wherein the first contact hole and the second contact hole overlap each other, when viewed on a plane, wherein the data line and the conductive pattern overlap the semiconductor pattern of the second transistor without overlapping the semiconductor pattern of each of the fourth transistor and the initialization transistor, wherein each of the plurality of data lines comprises a first sub data line extending in a first direction and a second sub data line extending in the first direction, wherein the first sub data line and the second sub data line are provided on both sides of a pixel column in which at least two or more of the plurality of pixels are arranged in the first direction, wherein one of the pixels of the pixel column is connected to the first sub data line, and another one of the pixels of the pixel column adjacent to the one of the pixels connected to the first sub data line is connected to the second sub data line, wherein each of the pixels of the pixel column is connected to one of the first sub data line and the second sub data line, and wherein an active pattern of the second transistor does not overlap the conductive pattern.

2. The display device according to claim 1, wherein:

the semiconductor pattern of each of the first transistor, the second transistor, and the initialization transistor is disposed on a substrate, and comprises an active pattern, and a first electrode and a second electrode connected to the active pattern;

each of the first transistor, the second transistor, and the initialization transistor further comprises a gate electrode disposed on the active pattern; and wherein the first contact hole is connected to the first electrode of the second transistor.

3. The display device according to claim 2, further comprising:

a gate insulating layer disposed on the semiconductor pattern of each of the first transistor, the second transistor, and the initialization transistor;

a first interlayer insulating layer disposed on the gate insulating layer;

a second interlayer insulating layer disposed on the first interlayer insulating layer; and a third interlayer insulating layer disposed on the second interlayer insulating layer, wherein the gate electrode is disposed on the gate insulating layer.

4. The display device according to claim 3, wherein the conductive pattern comprises a bridge pattern;

wherein the bridge pattern is disposed on the second interlayer insulating layer, and wherein the first contact hole passes through the gate insulating layer, the first interlayer insulating layer, and the second interlayer insulating layer.

5. The display device according to claim 4, wherein the data line is disposed on the third interlayer insulating layer, and wherein the second contact hole passes through the third interlayer insulating layer.

6. The display device according to claim 5, wherein each of the plurality of pixels further comprises:

a fifth transistor connected between a first power source and the first transistor; and a sixth transistor connected between the first transistor and the first electrode of the light-emitting element.

7. The display device according to claim 6, wherein each of the third to sixth transistors comprises:

a semiconductor pattern disposed on the substrate, and comprising an active pattern, and a first electrode and a second electrode connected to the active pattern; and a gate electrode disposed on the active pattern.

8. The display device according to claim 7, wherein the bridge pattern is spaced apart from the semiconductor pattern of the fourth transistor, when viewed on a plane.

9. The display device according to claim 7, wherein the bridge pattern is spaced apart from the semiconductor pattern of the initialization transistor, when viewed on a plane.

10. The display device according to claim 7, further comprising:

one or more scan lines to supply one or more scan signals to the gate electrodes of the second transistor, the third transistor, the fourth transistor, and the initialization transistor, wherein the one or more scan lines are disposed on the gate insulating layer.

11. The display device according to claim 10, further comprising:

an emission line to supply an emission signal to the gate electrode of each of the fifth transistor and the sixth transistor, wherein the emission line is disposed on the gate insulating layer.

12. The display device according to claim 6, wherein each of the plurality of pixels further comprises:

a storage capacitor connected between the first power source and the gate electrode of the first transistor.

13. The display device according to claim 12, wherein the storage capacitor comprises a lower electrode disposed on the gate insulating layer, and an upper electrode disposed on the first interlayer insulating layer.

14. The display device according to claim 1, further comprising:

a plurality of demultiplexers each connected to some of the plurality of data lines.

* * * * *